United States Patent [19]

Caserta et al.

[11] Patent Number: 4,924,080

[45] Date of Patent: May 8, 1990

[54] ELECTROMAGNETIC INTERFERENCE PROTECTION FOR IMAGE INTENSIFIER TUBE

[75] Inventors: Joseph N. Caserta; William D. Mims, both of Roanoke; Joseph Reed, Arlington; James H. Bowen, Salem, all of Va.

[73] Assignee: ITT Corporation, New York, N.Y.

[21] Appl. No.: 215,088

[22] Filed: Jul. 5, 1988

[51] Int. Cl.[5] ........................ H01J 31/50; H05K 9/00

[52] U.S. Cl. ................................................ 250/213 VT

[58] Field of Search ................. 361/111; 250/213 VT; 315/85, 8, 248; 313/544, 528, 532, 477 HC, 479; 174/35 R, 35 MS, 35 TS

[56] References Cited

U.S. PATENT DOCUMENTS

| | | | |
|---|---|---|---|
| H000,526 | 9/1988 | Miller | 174/35 MS |
| 3,372,285 | 3/1968 | Blazek et al. | 361/111 |
| 3,890,506 | 6/1975 | Berninger | 250/213 VT |
| 4,245,160 | 1/1981 | Harao | 250/213 VT |
| 4,331,898 | 5/1982 | Shimizu et al. | 250/213 VT |
| 4,467,002 | 8/1984 | Crofts | 174/35 MS |
| 4,539,617 | 9/1985 | Delaney et al. | 361/111 |
| 4,542,076 | 9/1985 | Bednarz et al. | 174/35 R |
| 4,561,775 | 12/1985 | Patrick et al. | 356/5 |
| 4,675,772 | 6/1987 | Epstein | 361/111 |
| 4,709,140 | 11/1987 | Oba | 250/213 VT |

*Primary Examiner*—David C. Nelms
*Assistant Examiner*—Michael Messinger
*Attorney, Agent, or Firm*—Thomas N. Twomey; Mary C. Werner

[57] ABSTRACT

An image intensifier tube having an electromagnetic interference protection arrangement. The protection is accomplished by shielding the tube and filtering the power supply. Shielding is performed by means of a conductive metallic coating which surrounds the image intensifier tube housing. Filtering is accomplished by using capacitors to short the interference to ground.

15 Claims, 3 Drawing Sheets

FIG. 5a
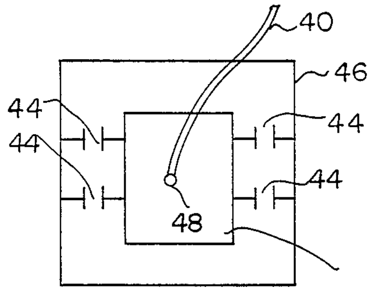
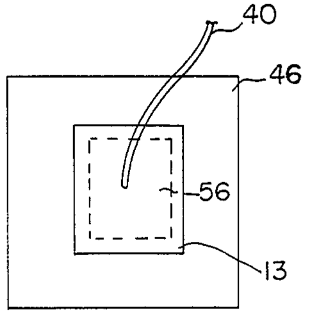
FIG.5b
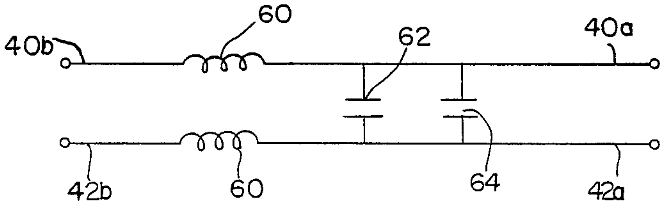
FIG. 6

ELECTROMAGNETIC INTERFERENCE PROTECTION FOR IMAGE INTENSIFIER TUBE

BACKGROUND OF THE INVENTION

This invention relates to an image intensifier tube and more particularly to electromagnetic interference (EMI) protected image intensifier.

Image intensifier tubes multiply the amount of incident light they receive and thus provide an increase in light output which can be supplied either to a camera or directly to the eyes of a viewer. These devices are particularly useful for providing images from dark regions and have both industrial and military application. For example, these devices are used for enhancing the night vision of aviators, for photographing astronomical bodies and for providing night vision to sufferers of retinitis pigmentosa (night blindness).

Modern image intensifier tubes include three main components, namely a photocathode, a phosphor screen (anode) and a microchannel plate (MCP) positioned intermediate the photocathode and anode. The photocathode is extremely sensitive to low-radiation levels of infrared light in the 580–900 nm (red) spectral range. The MCP is a thin glass plate having an array of microscopic holes through it. Each hole is capable of acting as a channel-type secondary emission electron multiplier. When the microchannel plate is placed in the plane of an electron image in an intensifier tube, one can achieve a gain of up to several thousand. Since each channel in a micro-channel plate operates nearly independently of all the others, a bright point source of light will saturate a few channels but will not spread out over adjacent areas. This characteristic of "local saturation" makes these tubes more immune to blooming at bright areas.

When the image intensifier without EMI protection is operated in an electromagnetic field, such as in the vicinity of an operating high power radio or radar transmitter, the image intensifier will suffer degradation in performance. The output will either go black or very bright or some point in between, depending on the design of the power supply. Increased brightness is distracting and in extreme situations will cause the user to lose all contrast, producing a blank viewing screen.

It is therefore an object of the present invention to provide an image intensifier tube having protection from electromagnetic interference.

It is an additional object of the invention to provide a method of making such a tube in a highly economical and efficient manner.

These objects and others which will become apparent hereinafter are accomplished by the present invention which provides an image intensifier device including means for amplifying an image formed of photons of light; power supply means for operating the amplifying means; and means for protecting the amplifying means and the power supply means for electromagnetic interference.

The present invention also provides a method for protecting an image intensifier tube from electromagentic interference by directing electromagnetic interference from a power input location to ground, and shielding the tube by applying a conductive coating to reflect the interference away from the tube.

BRIEF DESCRIPTION OF THE DRAWING

The above-mentioned and other features and objects of the invention will become more apparent by reference to the following description taken in conjunction with the accompanying drawings in which:

FIGS. 5(*a*) and (*b*) are views of the power input assembly; and

FIG. 6 is a schematic of a filter for the power supply.

DETAILED DESCRIPTION OF THE INVENTION

Figure 1:
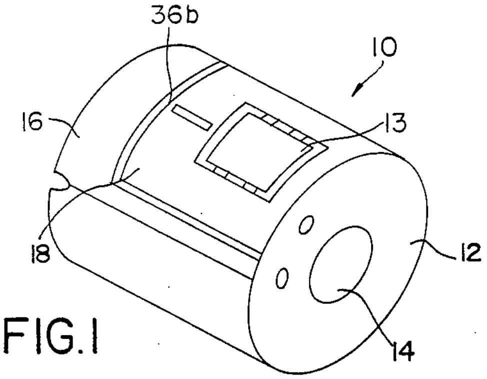
FIG. 1 is a perspective view of the power supply and housing of the image intensifier tube of this invention.

In FIG. 1 there is shown a perspective view of an image intensifier tube assembly 10. The image intensifier tube assembly 10 includes a power supply 12, a fiber optic output window 14, a housing 16 and a power supply contact assembly 18 including an energy input tab 13.

Figure 2:
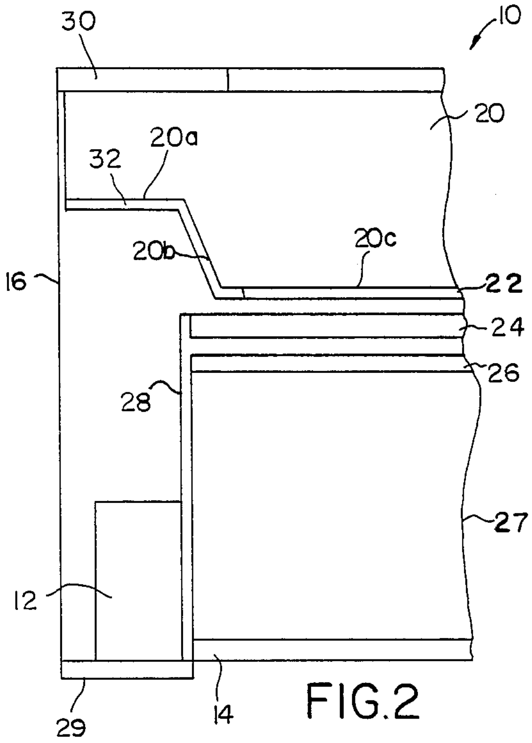
FIG. 2 is a cross-sectional view of the image intensifier tube.

FIG. 2 is a cross-sectional view of the image intensifier tube assembly 10 showing the major components thereof. The tube assembly 10 can be seen to comprise three basic components: a photocathode including a photoemissive wafer 22 coated on a faceplate 20; a microchannel plate 24 and an anode including a phosphor screen 26 which is deposited on a fiber-optic output window 28. A vacuum tube 28 extends from the MCP 24 to the output window 14. The power supply 12 is positioned around the vacuum tube 28 adjacent the output window 14. A retainer ring 29 seals the end of the tube adjacent the power supply 12. Both the faceplate and the output window are preferably formed from glass of high optical quality. The microchannel plate is also formed of a galss material which possesses a secondary emissive property and conductive characteristics.

The faceplate 20 receives and transmits light. It is normally sealed within the housing 16 and is surrounded by a peripheral flange 30. Light rays penetrate the faceplate 20 and are directed to the photoemissive wafer 22 which transforms the photons of light into electrons. The electrons are transmitted to the MCP 24 which operates to multiply the number of electrons, all in accordance with known principles. The usual photoemissive wafer is a suitable gallium arsenide (GaAs) device, but other suitable materials can be used. Connecting the photoemissive material 22 to an external biasing power supply 12 is a coating of conductive material 32 applied to surfaces 20*a*, 20*b* and a portion of 20*c* of the faceplate 20.

The microchannel plate is mounted in the tube 28 with both its input and output faces parallel to the photoemissive wafer 22 and the phosphor screen 26, respectively.

The image intensifier tube assembly is a self-contained unit with an integral high-voltage power supply. The power supply 12 includes automatic brightness control to provide a constant output image brightness over five orders-of-magnitude input illumination change as well as bright source protection to protect the photocathode 20 during exposure to high levels of light.

Energy is supplied to the power supply 12 by an external source, such as a battery (not shown). The battery supplies DC voltage to the power supply which converts the DC voltage to AC by known means. Although the current is low, the voltage supplied to the image intensifier components is relatively high, i.e. up to approximately 9000 volts. Voltage is supplied from the power supply 12 to the photoemissive wafer 22, the MCP 24 and the phosphor screen 26.

In operation, a radiation image impinging on the photocathode 20 causes the emission of electrons which are attracted to the MCP which is maintained at a higher positive potential than the photocathode 20. Each electron impinging on the MCP 24 results in the emission of a number of secondary electrons which in turn causes the emission of more secondary electrons. The electron gain or multiplication within the MCP 24 is controlled primarily by the potential difference applied across input and output surfaces of the MCP 24. The electrons emanating from MCP 24 and containing the input radiation image information impinge on phosphor screen 26 causing the screen to fluoresce and reproduce the input image.

Figure 3:
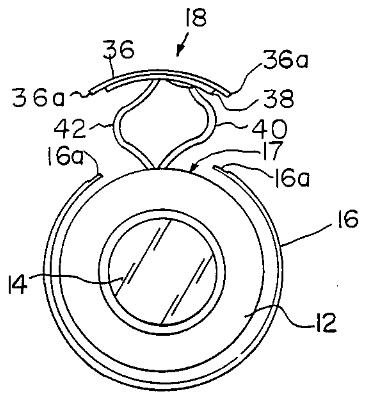
FIG. 3 is an end view of the power supply and housing.

Reference will now be made to FIG. 3. The housing 16 is generally formed of a nonconductive material, such as plastic. The housing 16 has an opening for the insertion of a contact assembly 18. The contact assembly has a back plate 36 and a contact plate 38 which is joined to the inner surface of the back plate 36. The back plate 36 at its sides 36a and bottom edge 36b (shown in FIG. 1) extends beyond the outer edges of the contact plate 38. When the contact assembly 18 is in position in the housing 16, the back plate 36 rests on a lip 16a of the housing and the lip 16a adjoins and is contiguous with the contact plate 38. Positive lead 40 and negative (ground) lead 42 extend between the power supply 12 and the contact assembly 18.

When the tube is operated in high electromagnetic fields (exceeding 20 volts/meter) the image intensifier will change in output brightness. This is due to electromagnetic energy which enters the image intensifier through the plastic housing and through the DC battery input.

It has been found that image intensifier tubes may be protected from the interference arising from electromagnetic fields by shielding the tube from the interference. In addition, the lower supply may be protected from EMI by a filtering arrangement.

Shielding is accomplished in the following manner. The outside surface of housing 16 and the portion of the inside of the housing 16 which is adjacent the power supply 12, and the outside surface of the back plate 36 and inside portion of the contact plate 38 which is adjacent the power supply 12 are coated with an electrically conductive material. The conductive material should be spaced from the power input tab 13. In addition the retainer ring 29 and flange 30 also have the conductive coating applied thereto in order to protect the ends of the tube assembly 10. It has been found that conductive materials such as silver, copper or aluminum, deposited to a depth of a few ten thousandths of an inch, provide good protective shielding. The coating may be applied in any suitable manner, for example, electroplating. The conductive material should form a continuous coating and be protected from corrosion. In addition it should be capable of forming a good solderable connection.

In a preferred form of shielding, the parts are coated with a layer of copper. Copper, however, is subject to oxidation which gives an unsightly appearance. An additional layer of conductive material is therefore added to the outer surface of the copper. However, many of the metals will seep into the copper. Therefore a layer of a buffer material is deposited on the outside of the copper before the deposition of the final metal coating. In the embodiment described herein, a layer of nickel is deposited on the outside of the copper layer, followed by a layer of tin. Copper is the primary shielding material and the layers of nickel and tin act as protective layers. The nickel acts as a buffer layer and the tin gives a good cosmetic appearance and is solderable. The nickel and tin layers may be thin, i.e. in the range of 5–10 μm.

Filtering of the power supply is accomplished by using distributed capacitance to short the EMI from the positive input contact 40 to the metallized contact assembly 18 which is thus grounded. It has been found that a capacitor represents a very low impedance (or short circuit) to high frequency which directs substantially all of the EMI away from the tube assembly. The small percentage of radio frequency that is not reflected by this arrangement is attenuated by the insertion-loss components in the power supply.

Figure 4:
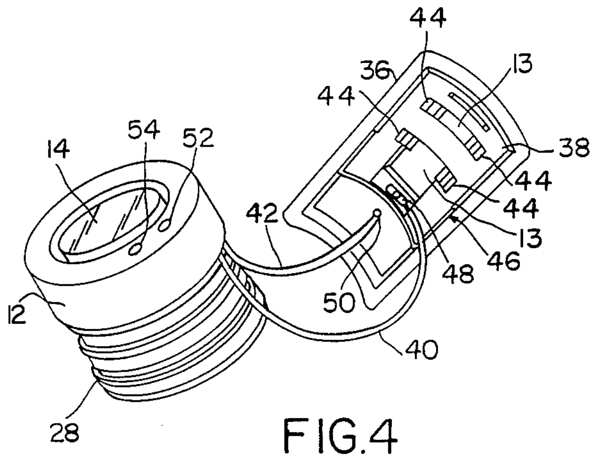
FIG. 4 is a view of the image tube filter.

Reference will now be made to FIGS. 4 and 5 which show one arrangement for the filtering of the tube assembly 10. In this arrangement four discrete 0.01 microfarad capacitors 44 are positioned on the inside surface of power input tab assembly 46. The capacitors are each joined at one end to the input tab assembly 46 and at the other end to the metallized portion of the contact plate 38. Positive lead 40 extends between the power supply 12 and is soldered to input tab 13 at contact 48. The negative lead 42 extends between the power supply 12 and is inserted into a feed-through hole 50 where it is soldered to the metalized back plate 36. The input tab 13 is soldered to the contact plate 38. Control screws for gain and saturation level are inserted at 52 and 54, respectively. The power input tab assembly is shown in more detail in FIG. 5(*a*). Alternatively, capacitance may be provided by an integral structure built into the housing.

In an alternate arrangement, as shown in FIG. 5(*b*), one large area 0.005 microfarad capacitor 56 may be used in place of the four smaller capacitors 44.

Any other arrangement which will short the high frequency is within the scope of this invention.

When the combination of shielding and filtering is used, the image intensifier tube assembly can be exposed to EMI of 200 volts/meter with only a 100% increase in intensity. With an EMI of 100 volts/meter, a 15% increase in intensity is achieved.

In addition to shielding of the housing, further filtering of the power supply may be required. One arrangement is illustrated in the schematic of FIG. 6. In this arrangement, the input power supply leads are filtered with two coils and two capacitors. The positive lead 40 has one end 40a connected to the power supply 12. The other end 40b is connected to the contact 48. The negative lead 42 has one end 42a connected to the power supply 12 and the other end connected to the metallized contact assembly. Intermediate the ends 40a–40b and 42a–42b are two coils each being 15 micro-henries. Capacitor 62 is 0.01 microfarad and capacitor 64 is 4.7 microfarads. The capacitors are placed in the circuit beween the power supply 12 and the coils 60. With this arrangement, the resistance presented to the electromagnetic energy being conducted in the line goes up as the frequency goes up.

In one method of performing the invention, the housing 16, the retainer ring 29, the flange 30 and the contact assembly 18 are electroplated to form a continuous conductive coating of metallic material. The capacitors 44 or 56 and power input tab 13 are joined to the contact assembly 18 and the leads joined to the power supply 12. The assembly is then put into the housing 16 and the space between the assembly and housing is filled with a nonconductive potting compound. The leads 40, 42 are then joined to the contact assembly 18. Additional potting compound is added to the tube. The contact assembly 18 is then positioned in an opening 17 in the housing. A conductive potting material is placed around the contact assembly 18 where it joins the housing 16. The conductive potting material is also placed around the ends of the tube where the retainer ring 29 and the flange 30 join the housing 16 to form a continuous conductive layer.

While in the foregoing, there has been described a preferred embodiment of the invention, it should be understood that various changes and modifications can be made without departing from the true spirit and scope of the invention.

What is claimed is:

1. A method of protecting a power supply for an image intensifier tube from electromagnetic interference comprising the steps of:

shielding the power supply by applying a conductive coating to a surface of a housing surrounding the tube and power supply to reflect the interference away from the power supply; and forming a low impedance path between the power supply and the conductive coating in order that electromagnetic interference entering the power supply along a connection from a voltage source located outside of the housing is directed to a lower potential area spaced from the power supply.

2. The method of claim 1 wherein the shielding step includes applying a layer of copper to the outer surface of the tube.

3. The method of claim 1 wherein the forming step includes capacitively directing the interference from the power input to ground.

4. An arrangement for shielding a power supply for an image intensifier tube comprising:

a housing surrounding the tube and the power supply;

a contact plate constituting one portion of said housing, said contact plate having an inner section and an outer section, said outer section coupled to a voltage source spaced from the housing;

means for transmitting voltage from said contact plate to the power supply for operating the image intensifier tube;

shielding means positioned on an outer surface of said houing for protecting the power supply from receiving electromagnetic interference through said housing and along said voltage transmitting means; and means coupled between said transmitting means and said contact place for filtering the power supply by providing a low impedance path to said shielding means for high frequency being passed to the power supply along the voltage source coupling.

5. The arrangement of claim 4 wherein said shielding means includes a layer of conductive material.

6. The arrangement of claim 5 wherein said conductive material is copper.

7. The arrangement of claim 5 wherein said conductive material is nickel.

8. The arrangement of claim 5 wherein said conductive material is tin.

9. The arrangement of claim 4 wherein said transmitting means includes a first lead connected between said inner section and the power supply, and a second lead connected between said outer section and the power supply.

10. The arrangement of claim 9 wherein the shielding means is additionally positioned on an inside surface of said housing which surrounds the power supply, on said outer section and a portion of said inner section of said contact plate.

11. The arrangement of claim 10 wherein said filtering means includes a capacitor coupled between said transmitting means and said portion of said inner section of said contact plate.

12. The arrangement of claim 10 wherein said shielding means includes a layer of copper, a layer of nickel positioned on the outside of said layer of copper and a layer of tin positioned on the outside of said nickel layer.

13. The arrangement of claim 4 wherein the tube operated by the power supply is maintained at a 15% increase in intensity when electromagnetic interference of 100 volts per meter is encountered.

14. The arrangement of claim 4 wherein the tube operated by the power supply is maintained at a 100% increase in intensity when electromagnetic interference of 200 volts per meter is encountered.

15. An arrangement for shielding a power supply assembly for an image intensifier tube comprising:

means for establishing an equi-potential surface surrounding the tube and the power supply assembly such that electromagnetic interference, approaching the power supply assembly through a connection originating outside of the surface, is bypassed to the equi-potential surface; and means for providing a low impedance path across the connection to the surface over a wide band of frequencies.

* * * * *